United States Patent
Chauhan et al.

(10) Patent No.: US 10,763,839 B2
(45) Date of Patent: Sep. 1, 2020

(54) BUFFER CIRCUIT

(71) Applicant: TEXAS INSTRUMENTS INCORPORATED, Dallas, TX (US)

(72) Inventors: Rajat Chauhan, Bangalore (IN); Srikanth Srinivasan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/357,975

(22) Filed: Mar. 19, 2019

(65) Prior Publication Data

US 2020/0021281 A1   Jan. 16, 2020

(30) Foreign Application Priority Data

Jul. 12, 2018   (IN) .............................. 201841026002

(51) Int. Cl.
| | |
|---|---|
| *H03K 19/094* | (2006.01) |
| *G11C 16/06* | (2006.01) |
| *G11C 16/12* | (2006.01) |
| *H03K 5/24* | (2006.01) |
| *H03K 3/356* | (2006.01) |

(52) U.S. Cl.
CPC .......... *H03K 5/2481* (2013.01); *H03K 3/356* (2013.01)

(58) Field of Classification Search
CPC ............................ H03K 5/2481; H03K 3/356
See application file for complete search history.

(56) References Cited

U.S. PATENT DOCUMENTS

| | | | | |
|---|---|---|---|---|
| 6,501,298 B1 * | 12/2002 | Terletzki | .......... | H03K 19/09429 326/68 |
| 6,646,918 B2 * | 11/2003 | Kurokawa | ............. | G11C 16/12 365/185.18 |

* cited by examiner

*Primary Examiner* — Kenneth B Wells
(74) *Attorney, Agent, or Firm* — Mark Allen Valetti; Charles A. Brill; Frank D. Cimino

(57) ABSTRACT

Aspects of the present disclosure provide for a circuit. In at least some examples, the circuit includes a first diode, a second diode, a comparator having a comparator first arm and a comparator second arm, and an inverter. The first diode has a first terminal coupled to a first node and a second terminal. The second diode is coupled in series between the second terminal of the first diode and a second node. The comparator first arm includes a first plurality of transistor devices and is coupled to a third node. The comparator second arm includes a second plurality of transistor devices and is coupled to the second node, wherein the second plurality of transistor devices is greater in number than the first plurality of transistor devices. The inverter has an input coupled to the comparator and an output coupled to a fourth node.

13 Claims, 6 Drawing Sheets

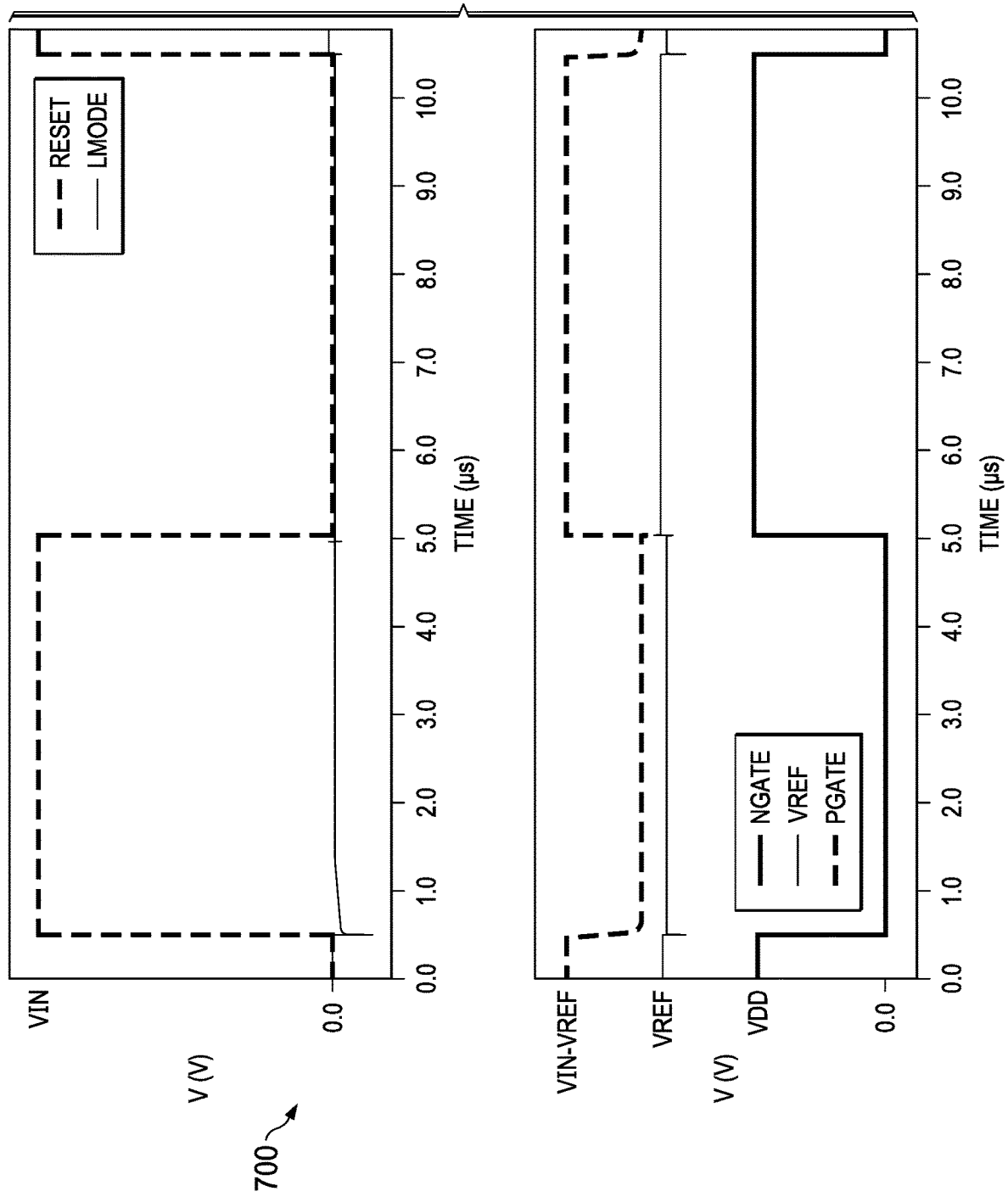

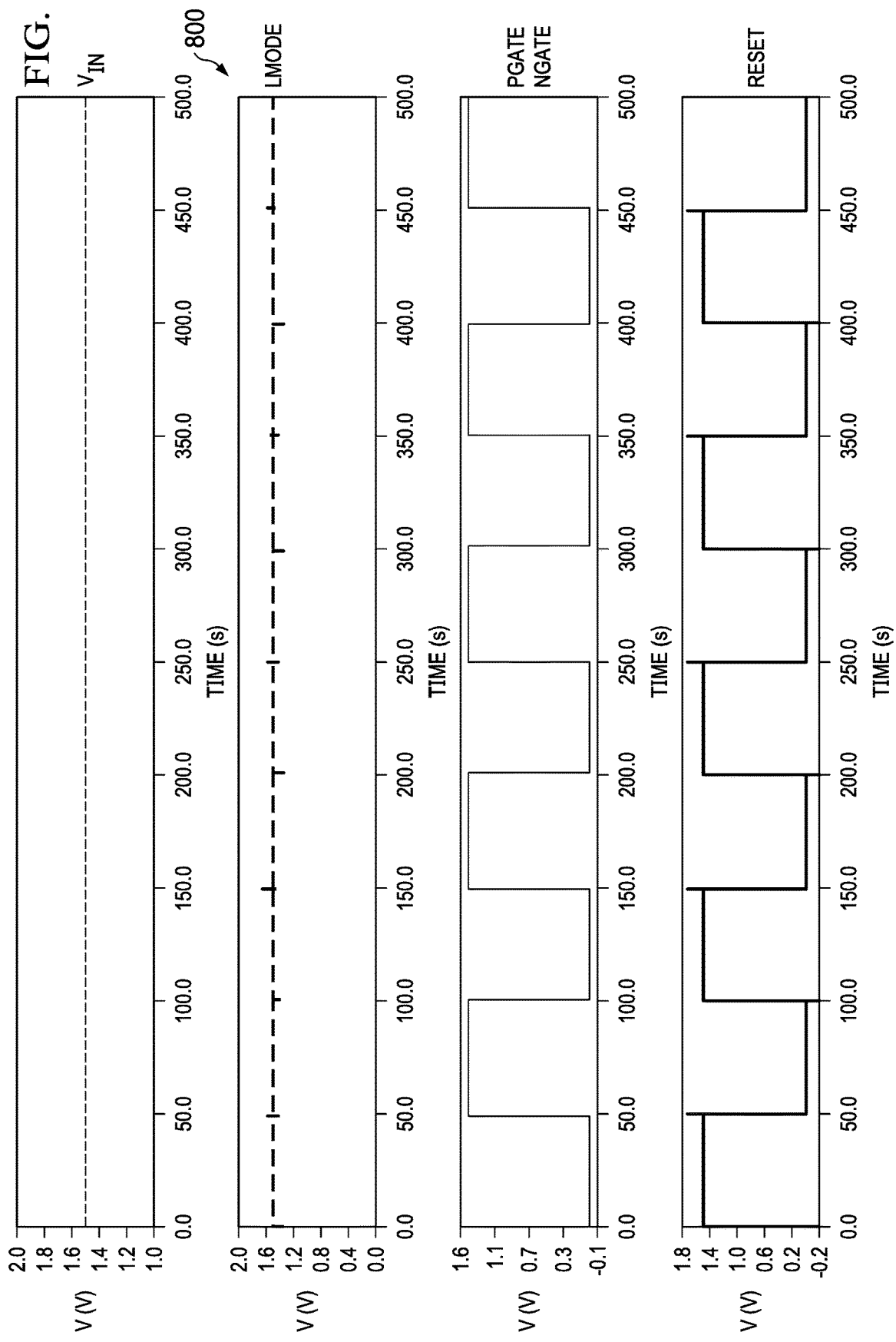

BUFFER CIRCUIT

CROSS-REFERENCE TO RELATED APPLICATIONS

The present application claims priority to Indian Provisional Patent Application No. 201841026002, which was filed Jul. 12, 2018, is titled "An Ultra-Low Leakage, Wide Supply Voltage Output Buffer Using Low-Voltage Gate Oxide," and is hereby incorporated herein by reference in its entirety.

BACKGROUND

In various systems, a supply voltage supervisor (SVS) circuit monitors a supply voltage of the system for over-voltage and/or under-voltage conditions. When the over-voltage or under-voltage condition occurs, the SVS circuit generates a reset signal to prevent a component, circuit, or device receiving the supply voltage from being damaged due to over-voltage conditions or operating in an unexpected manner due to under-voltage conditions. The reset signal is sometimes generated by an output buffer circuit.

SUMMARY

Some aspects of the present disclosure provide for a circuit. In at least some examples, the circuit includes a first diode, a second diode, a comparator having a comparator first arm and a comparator second arm, and an inverter. The first diode has a first terminal coupled to a first node and a second terminal. The second diode is coupled in series between the second terminal of the first diode and a second node. The comparator first arm includes a first plurality of transistor devices and is coupled to a third node. The comparator second arm includes a second plurality of transistor devices and is coupled to the second node, wherein the second plurality of transistor devices is greater in number than the first plurality of transistor devices. The inverter has an input coupled to the comparator and an output coupled to a fourth node.

Other aspects of the present disclosure provide for a circuit. In at least some examples, the circuit includes a signal generator and a level shifter. The signal generator includes a semiconductor device and a comparator. The semiconductor device is configured to receive an input voltage (VIN) and generate a reference voltage (VREF) based on a difference between VIN and a threshold voltage of a semiconductor device. The comparator is coupled to an inverter and configured to generate a control signal (LMODE) according to VREF with respect to zero. The level shifter is coupled to the signal generator and configured to generate an output signal having a value within a range having a lower bound of zero volts and an upper bound of VIN when LMODE is being asserted and generate the output signal having a value within a range having a lower bound of VREF plus the threshold voltage of the semiconductor device and an upper bound of VIN when LMODE is not being asserted.

Other aspects of the present disclosure provide for a system. In at least some examples, the system includes a battery, a load coupled to the battery, and a supply voltage supervisor (SVS) coupled to the battery and the load. The load is configured to receive VIN from the battery. The SVS includes an output buffer that comprises a signal generator and a level shifter coupled to the signal generator. The signal generator is configured to receive VIN and generate a VREF according to VIN minus a threshold voltage of a semiconductor device and generate LMODE according to a value of VREF with respect to zero. The level shifter is configured to generate an output signal having a value within a range having a lower bound of zero volts and an upper bound of VIN when LMODE has a first logical value and generate the output signal having a value within a range having a lower bound of VREF plus the threshold voltage of the semiconductor device and an upper bound of VIN when LMODE has a second logical value.

BRIEF DESCRIPTION OF THE DRAWINGS

For a detailed description of various examples, reference will now be made to the accompanying drawings in which:

FIG. 7 shows a diagram of illustrative signals in accordance with various examples; and FIG. 8 shows a diagram of illustrative signals in accordance with various examples.

DETAILED DESCRIPTION

Modern circuit implementations can be subjected to conflicting performance requirements. For example, to create a circuit having applicability or suitability across a multitude of applications, a performance requirement of wide input voltage range (e.g., supply voltage range) may exist, and to create a circuit optimized for powering by a battery, a performance requirement of minimal quiescent current (Iq) draw may exist. In at least some circumstances, these performance requirements are in opposition to each other.

At least some aspects of the present disclosure provide for a buffer circuit. The buffer circuit is, in some examples, suitable for implementation in a SVS as an output buffer of the SVS. The buffer circuit, in at least some examples, is able to withstand and operate with an input voltage signal that exceeds a voltage rating of one or more components of the buffer circuit (e.g., such as gate oxide voltage ratings of one or more transistors of the buffer circuit). In at least some examples, the buffer circuit additionally operates at a low Iq, (e.g., in at least some examples, less than about 15 nanoamps (nA)). In at least some examples, the buffer circuit implements a level shifter configured to shift a voltage level of a data signal (DATA) received by the buffer circuit for driving the buffer circuit from a range of zero to a digital supply voltage (Vdd) to a range of a reference voltage (VREF) plus a threshold voltage (Vt) to VIN. In at least some examples, shifting the voltage level of DATA protects one or more components of the buffer circuit from damage when the value of VIN creates a condition that exceeds operational limits of the one or more components. For example, shifting the voltage level of DATA can protect a transistor from experiencing a gate-to-source voltage (Vgs) of a value greater than the transistor can tolerate without damage. For example, when the transistor is a thin-oxide transistor, the transistor may be rated for a Vgs of about 5 volts (V) and the level shifter may shift the level of DATA from the range of 0 to VIN to the range of VREF+Vt to VIN to prevent the transistor from experiencing a Vgs greater than 5 V when VIN increases, such as greater than about 5 V, greater than about 4 V, or any other suitable value.

Figure 1:
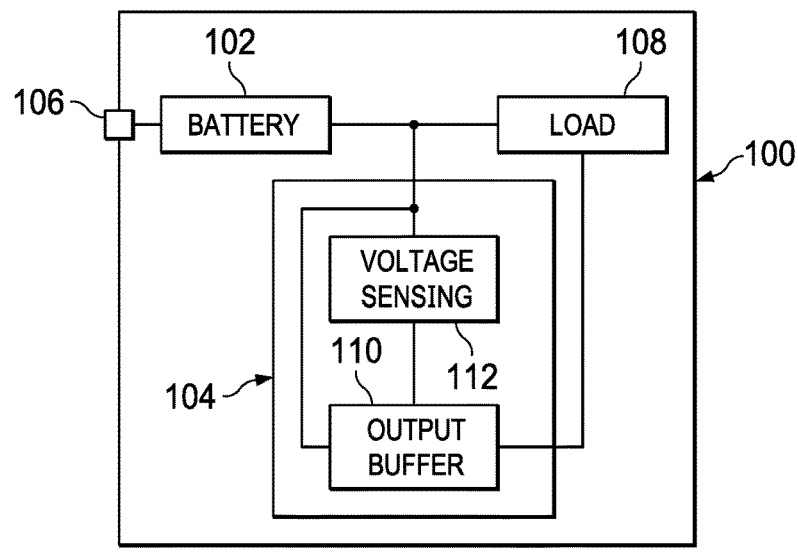
FIG. 1 shows a block diagram of an illustrative system in accordance with various examples.

Turning now to FIG. 1, a block diagram of an illustrative system 100 is shown. In at least some examples, the system 100 is representative of a consumer or other electronic device, such as a wearable device (e.g., a headset, earbuds, hearing aids, smart watches, fitness accessories, patient monitors, etc.), a smartphone, a laptop computer, a notebook or netbook computer, a tablet device, a power tool, or any other device that is powered by a battery and/or a mains voltage (e.g., via an adapter). In other examples, the system 100 is representative of a device that is battery powered and utilized in an environment or in a manner in which the battery is unable to be removed and replaced, or recharged, for an extended period of time. For example, the device may be an industrial sensor meant to be deployed and unreachable for an extended period of time, may be deployed in a location in which the battery is available for recharging but a power source for recharging the battery is not available for an extended period of time, or the device may be deployed to an unrecoverable environment (e.g., outer-space, another planet, deep-sea, etc.). In such applications, it may be advantageous for the system 100 to operate across a range of VIN values so that a maximum power output of the battery may be increased to increase longevity and operational usefulness of the system 100. In such examples, it may be advantageous for components of the system 100 to tolerate, and operate using, input voltages that exceed rated specifications of the components of the system 100 and for the components of the system 100 to minimize current drawn from the battery in as many circumstances as practicable.

In various examples, the system 100 includes a battery 102, a SVS circuit 104, an adapter port 106, and a load 108. In some examples, the battery 102 is non-rechargeable, while in other examples the battery is configured to be recharged within the system 100 or external to the system 100 after the battery 102 is removed from the system 100. The battery 102 is any suitable type of battery that is capable of providing power to components of the system 100, such as at least the load 108, and in some circumstances, the SVS circuit 104 and/or the adapter port 106 (e.g., such as in a circumstance in which power is provided from the battery 102 to a device (not shown) coupled to the adapter port 106 to charge and/or power the device coupled to the adapter port 106). In at least one example, the SVS circuit 104 monitors a value of a voltage provided to the load 108, whether provided by the battery 102, from the adapter port 106, or both. For example, the SVS circuit 104 monitors a value of a voltage signal (referred to from the perspective of the SVS circuit 104 as an input voltage (VIN) provided to the load 108 with respect to a second reference voltage. In at least some examples, the SVS circuit 104 compares VIN (or a voltage derived from VIN) to VREF to determine whether VIN is greater than the second VREF and/or less than the second VREF, and in some examples, generates and provides a signal (RESET) to reset the load 108 to prevent the load 108 from damage in over-voltage circumstances (e.g., when VIN is greater than the second VREF) or damage and/or unintended operation in under-voltage (e.g., brown-out) circumstances (e.g., when VIN is less than the second VREF). In at least some examples, the SVS circuit 104 comprises an output buffer 110. RESET is generated, in some examples, by the output buffer 110 based on a signal (e.g., DATA) representing the result of the comparison between VIN and the second VREF. In at least some examples, the comparison between VIN and the second VREF is performed by a voltage sensing circuit 112. In an example, the SVS circuit 104 is a single chip housed inside a package. In another example, the SVS circuit 104 includes circuitry distributed across multiple chips, with all such chips housed inside a single package. In yet other examples, various packages housing chips are coupled together to create the functionality of the SVS circuit 104.

In at least some examples, the SVS circuit 104 is coupled to the battery 102, the load 108, and the adapter port 106, to which, in some examples, a power supply (not shown) couples to provide power (e.g., mains power) to the system 100. For example, the adapter port 106 is suitable for connection by a user to mains power via an adapter (not shown) or to a device for powering the device, as discussed above. The load 108 is additionally coupled to the battery 102 and the adapter port 106. The system 100 is merely an example system in which the SVS circuit 104 can be implemented, and other implementations can include additional, or alternative components, such as power management components coupled between the adapter port 106 and other components of the system 100 and/or coupled between the battery 102 and other components of the system 100. For example, in at least some architectures, an inverter (not shown) is coupled between the voltage sensing circuit 112 and the output buffer 110 such that a data output of the voltage sensing circuit 112 is inverted prior to processing by the voltage buffer 110.

In at least one example of operation, the SVS circuit 104 (e.g., via the voltage sensing circuit 112) monitors power provided by the adapter port 106 and/or the battery 102 to the load 108. In some examples, when the voltage sensing circuit 112 determines that VIN, or a signal based on VIN, exceeds the second VREF, the voltage sensing circuit 112 outputs DATA as a logical high value. The output buffer 110 receives DATA and, based on DATA, generates and provides RESET having a logical low value to the load 108. In other examples, when the voltage sensing circuit 112 determines that VIN, or the signal based on VIN, falls below the second VREF, the output buffer 110 generates and provides RESET having a logical high value to the load 108. In yet other examples, DATA has a logical high value when VIN, or the signal based on VIN, is less than the second VREF and RESET is generated to have a logical low value.

In some examples, the output buffer 110 implements techniques alluded to above and described in greater detail below to generate RESET based on a VIN that exceeds input voltage specification and/or tolerances of at least some components (not shown) of the output buffer 110. These techniques are, in some examples, helpful in extending a battery life of the battery 102 (e.g., an amount of time of use of the system 100 before the battery 102 discharges when operating without mains power received at the adapter port 106 or recharging or replacing the battery 102).

Figure 2:
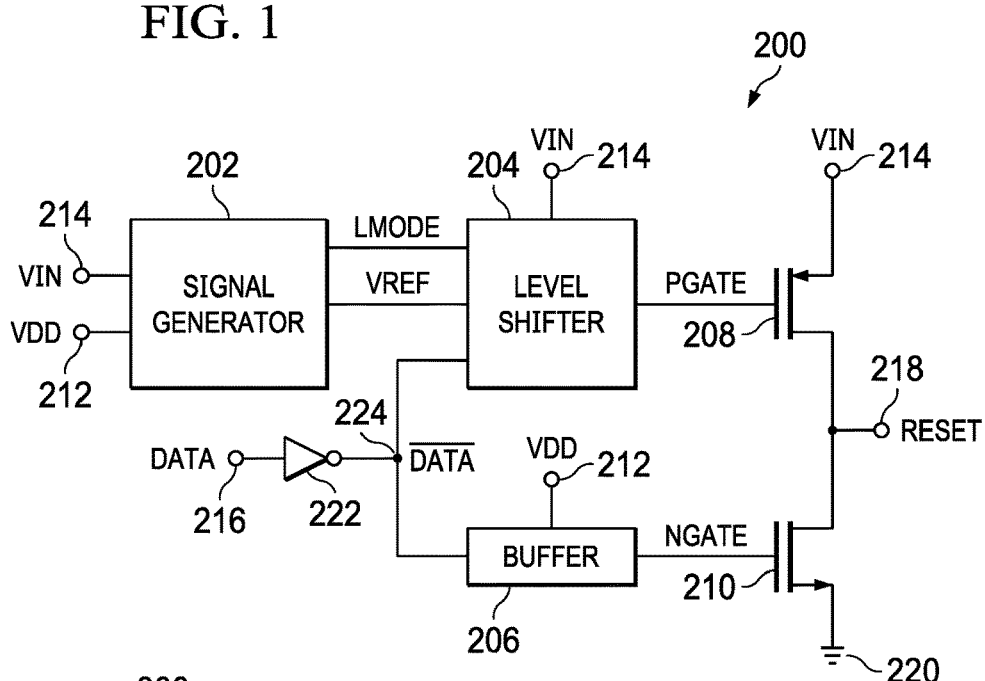
FIG. 2 shows a block diagram of an illustrative circuit in accordance with various examples.

Turning now to FIG. 2, a block diagram of an illustrative circuit 200 is shown. In at least some examples, the circuit 200 is suitable for implementation as the output buffer 110 of FIG. 1. For example, at least some implementations of the circuit 200 are suitable for generating a reset signal indicating a result of a comparison between VIN and the second VREF. In some further implementations, the circuit 200 is suitable for generating a buffered output signal from VIN based on a VIN that exceeds specified tolerances (VSAFE) of at least some components of the circuit 200 by protecting against large values of VIN that exceed VSAFE and might otherwise damage one or more components of the circuit 200.

In at least one example architecture, the circuit 200 includes a signal generator 202, a level shifter 204, a buffer 206, transistor 208, and a transistor 210. In at least some examples, the signal generator 202 is coupled to node 212, a node 214, and the level shifter 204. The level shifter 204 has an input coupled to a node 224, an output coupled to a gate terminal of the transistor 208, and is coupled to the node 214. The buffer 206 has an input coupled to the node 224, an output coupled to a gate terminal of the transistor 210, and is coupled to the node 212. The transistor 208 has a source terminal coupled to the node 214 and a drain terminal coupled to a node 218. The transistor 210 has a source terminal coupled to a ground terminal 220 and a drain terminal coupled to the node 218. In at least some examples, the transistor 208 is a drain-extended p-type metal oxide semiconductor field effect transistor (MOSFET) (DePMOS) and the transistor 210 is a drain-extended n-type MOSFET (DeNMOS). In at least some examples, the node 212 is configured to couple a voltage source (not shown) to receive Vdd, where Vdd has a value of less than about 5 V. The node 214 is configured to couple to a voltage source (not shown) to receive VIN, wherein VIN has a value ranging from about 1.4 V to 10 V or greater. A node 216 is configured to receive DATA, for example, from a voltage sensing circuit. The node 218 is an output of the circuit 200 and is configured to provide RESET. The ground terminal 220 is configured to couple to a ground voltage potential. In at least some examples, the circuit 200 further includes an inverter 222 having an input coupled to the node 216 an output coupled to the node 224 such that DATA received at the node 216 is inverted to provide an inverse of DATA at the node 224. Alternatively, in examples of the circuit 200 in which the inverter 222 is omitted, the node 216 and the node 224 are shorted together such that they are considered the same node. In at least some examples of the circuit 200 in which the inverter 222 is omitted, the inverse of DATA is received at the node 216 instead of DATA (e.g., such as after having been inverted by another component not a part of the circuit 200 but coupled to the circuit 200).

In an example of operation, the circuit 200 is configured to generate RESET based on DATA. To generate RESET, the transistor 208 is controlled to couple the node 218 to the node 214 to generate a logical high value of RESET and the transistor 210 is configured to couple the node 218 to the ground terminal 220 to generate a logical low value of RESET. However, in at least some examples VIN has a value large enough that Vgs of the transistor 208 exceeds VSAFE of the transistor 208, potentially causing unexpected behavior and/or damage to the transistor 208, the circuit 200, and/or a device coupled to the node 218 and configured to receive RESET. To mitigate the possibility of a value of VIN causing Vgs of the transistor to exceed VSAFE of the transistor 208, in at least some examples the level shifter 204 shifts a value of the inverse of DATA based on the value of VIN. For example, the level shifter 204 shifts the value of the inverse of DATA based on VREF and a mode control signal (LMODE), where VREF is determined according to VIN minus a predefined voltage drop and LMODE is determined according to a value of VREF, to form a signal PGATE for controlling the transistor 208. The buffer 206 buffers the inverse of DATA before providing a signal (NGATE) based on the inverse of DATA to the gate terminal of the transistor 210 for control of the transistor 210. In various examples, the buffer 206 is any suitable buffer circuit, the scope of which is not limited herein. For example, in at least one implementation, the buffer 206 includes one or more push-pull MOSFET inverters (e.g., such as four push-pull MOSFET inverters) operating from Vdd. In other examples, the buffer 206 is a unity gain amplifier. In yet other examples, the buffer 206 is any circuit, component, or combination of components configured to provide a buffer and/or isolation between any two nodes and/or delay propagation of a signal between the two nodes.

In at least some examples, the signal generator 202 generates VREF and LMODE. VREF and LMODE are generated, in at least some examples, according to VIN. Generating VREF and LMODE according to VIN (e.g., in the same voltage domain where LMODE is toggled by VREF and therefore dependent on VIN) is advantageous in increasing reliability of the circuit 200, for example, in substantially concurrently generating VREF and LMODE when VIN-VREF exceeds VSAFE. The signal generator 202 generates VREF, in some examples, by coupling one or more diodes (not shown) in series between VIN and a terminal at which VREF is provided. In this way, VREF is approximately equal to VIN minus X*Vt, where Vt is a voltage drop associated with the diode(s) and X is the number of diodes coupled in series. In other examples, one or more of the diodes may each be replaced by a MOSFET configured in a diode configuration. In yet other examples, the plurality of diodes and/or MOSFETs may be replaced by a single MOSFET having a transistor length determined to provide approximately a same Vt as the plurality of diodes and/or MOSFETs.

The signal generator 202 generates LMODE, in some examples, based on a comparison result. For example, when VREF is less than or equal to 0, a comparator outputs a logical low level signal, which is inverted by a buffer to form a logical high signal for output as LMODE. Similarly, when VREF is greater than 0, the comparator outputs a logical high level signal, which is inverted by the buffer to form a logical low signal for output as LMODE.

The level shifter 204, in some examples is a reduced-swing level shifter. For example, based on a value of LMODE, the swing of the level shifter 204 is modulated. In at least one example, when LMODE has a logical high value, the level shifter 204 operates as a full-swing level shifter. When LMODE has a logical low value, the level shifter 204 operates as a high-voltage half-swing level shifter. For example, when LMODE has the logical high value, the level shifter 204 operates with a swing of about 0 V to about VIN. When LMODE has the logical low value, the level shifter 204 operates with a swing of about VREF+Vt to about VIN. In this way, when VIN exceeds X*Vt, a lower limit to the value of the inverse of DATA is shifted to prevent the transistor 208 from experiencing a Vgs greater than VSAFE. Based on the output of the level shifter 204 and the buffer 206, the transistor 208 and the transistor 210, respectively, are controlled to generate RESET, where, at a given time, a value of RESET is an inversion of a value of the inverse of DATA such that a value of RESET follows a value of DATA (e.g., when DATA has a logical high value, RESET has a logical high value and when DATA has a logical low value, RESET has a logical low value).

Figure 3:
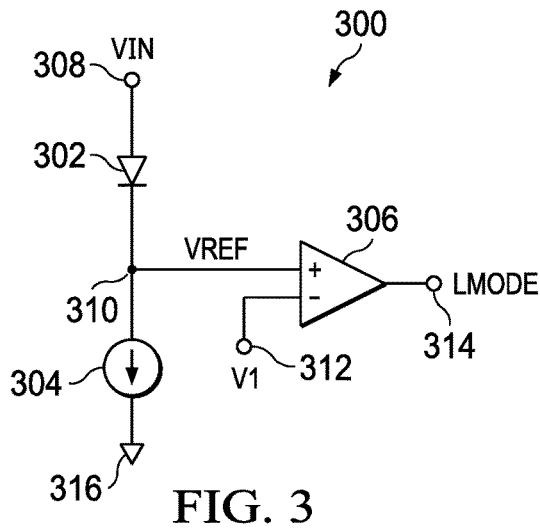
FIG. 3 shows a block diagram of an illustrative circuit in accordance with various examples.

Turning now to FIG. 3, a block diagram of an illustrative circuit 300 is shown. In at least some examples, the circuit 300 is suitable for implementation as the signal generator 202 of the circuit 200 of FIG. 2. In at least some examples, the signal generator includes a diode 302, a current source 304, and a comparator 306. In an example architecture of the circuit 300, the diode 302 has an anode configured to couple to an input voltage terminal 308 and a cathode coupled to a node 310, the comparator 306 has a first input coupled to the node 310 and a second input coupled to a node 312 that is configured to receive a voltage V1, where V1 is variable from about 0 V to about VIN. An output of the comparator 306 is coupled to a node 314 and configured to provide LMODE at the node 314. The current source 304 is coupled between the node 310 and a ground terminal 316 and configured to sink current from the node 310 to the ground terminal 316.

In an example of operation of the circuit 300, the diode 302 drops an amount of voltage Vt between the input voltage terminal and the node 310 to create VREF, such that VREF at node 310 is approximately equal to VIN−Vt. The comparator 306 compares VREF to V1 and outputs LMODE according to that comparison. For example, when VREF is greater than V1, the comparator 306 outputs LMODE having a logical high value and when VREF is less than or equal to V1, the comparator 306 outputs LMODE having a logical low value. In this way, LMODE and VREF each track from a same voltage supply coupled to the input voltage terminal 308 and have a rapid response time from a change in VREF to a corresponding change in LMODE. While illustrated as a single diode, in at least some examples the diode 302 is implemented as a diode stack to achieve a desired cumulative Vt of the semiconductor devices implemented in the diode stack. Additionally, the diode 302, in at least some examples, is implemented by a MOSFET device coupled in a diode configuration.

Figure 4:
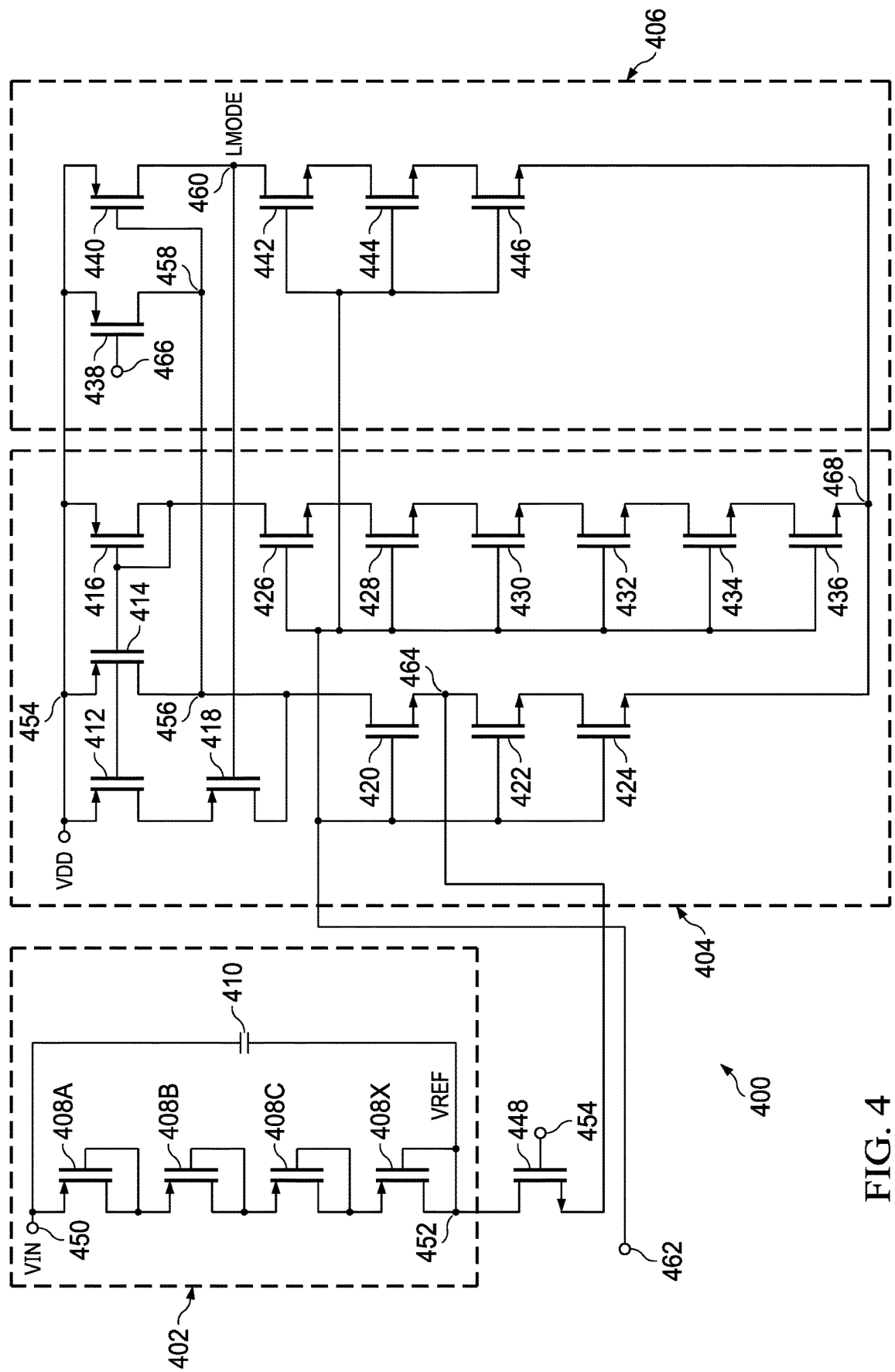
FIG. 4 shows a schematic diagram of an illustrative circuit in accordance with various examples.

Turning now to FIG. 4, a schematic diagram of an illustrative circuit 400 is shown. In at least some examples, the circuit 400 is suitable for implementation as the signal generator 202 of the circuit 200 of FIG. 2. In at least some examples, the circuit 400 includes a VREF generator 402, a comparator 404, and an inverter 406. The VREF generator 402, in some examples, includes a plurality of semiconductor devices 408A, 408B, 408C, . . . 408X, where X is determined according to a desired voltage drop of VREF with respect to VIN. For example, as discussed above, VREF is approximately equal to VIN minus X*Vt, such that increasing the number of semiconductor devices (increasing X) decreases VREF with respect to VIN and decreasing the number of semiconductor devices (decreasing X) increases VREF with respect to VIN. Each of the plurality of semiconductor devices 408A, 408B, 408C, . . . 408X are, in at least one example, p-type MOSFETs (pFETs) configured in a diode configuration. In at least some examples, generating VREF through the use of pFETs is advantageous in facilitating threshold variation matching, increased performance, increased reliability, and decreased physical footprint when compared to other semiconductor devices. In another example, at least some of the plurality of semiconductor devices 408A, 408B, 408C, . . . 408X are diodes. In at least some examples, the VREF generator 402 further includes a capacitor 410. The comparator 404 includes, in some examples, a pFET 412, a pFET 414, a pFET 416, a p-FET 418, an n-type MOSFET (nFET) 420, a nFET 422, a nFET 424, a nFET 426, a nFET 428, a nFET 430, a nFET 432, a nFET 434, and a nFET 436. The inverter 406 includes, in at least some examples, a pFET 438, a pFET 440, a nFET 442, a nFET 444, and a nFET 446. In at least some examples, the VREF generator 402 is coupled to the comparator 404 via a nFET 448.

In an example architecture of the circuit 400, the plurality of semiconductor devices 408A, 408B, 408C, . . . 408X are each pFET transistors coupled in series in a diode configuration between a node 450 and a node 452 and the capacitor 410 is coupled between the node 450 and the node 452. The nFET 448 has a drain terminal coupled to the node 452, a gate terminal coupled to a node 454, and a source terminal coupled to a node 464. The pFET 412 has a source terminal coupled to the node 454, a gate terminal coupled to a node 458, and a drain terminal. The pFET 414 has a source terminal coupled to the node 454, a gate terminal coupled to the node 458, and a drain terminal coupled to a node 456. The pFET 416 has a source terminal coupled to the node 454, a gate terminal coupled to the node 458, and a drain terminal coupled to the node 458. The pFET 418 has a source terminal coupled to the drain terminal of the pFET 412, a gate terminal coupled to a node 460, and a drain terminal coupled to the node 456. The nFET 420 has a drain terminal coupled to the node 456, a gate terminal coupled to a node 462, and a source terminal coupled to the node 464. The nFET 422 and the nFET 424 are coupled in series between the node 464 and a node 468, each with a gate terminal coupled to the node 462. The nFET 426, nFET 428, nFET 430, nFET 432, nFET 434, and nFET 436 are coupled in series between the node 458 and the node 468, each with a gate terminal coupled to the node 462. The pFET 438 has a source terminal coupled to the node 454, a gate terminal coupled to a node 466, and a drain terminal coupled to the node 456. The pFET 440 has a source terminal coupled to the node 454, a gate terminal coupled to the node 456, and a drain terminal coupled to the node 460. The nFET 442, nFET 444, and nFET 446 are coupled in series between the node 460 and the node 468, each with a gate terminal coupled to the node 462. In at least some examples, the node 450 is configured to receive VIN, the node 452 is configured to output VREF, the node 454 is configured to receive Vdd, the node 460 is configured to output LMODE, the node 462 is configured to receive a reference voltage, and the node 468 is configured to couple to a ground voltage potential. In at least some examples, the reference voltage is derived from a reference current. For example, the reference voltage may be determined according to a diode stack (not shown) through which the reference current flows. In various examples, the reference voltage is received, generated, and/or determined according to any suitable means and from any suitable source.

In an example of operation of the circuit 400, when VIN is less than X*Vt, VREF has a value of approximately 0 V. For example, when VIN is less than X*Vt, one or more of the plurality of semiconductor devices 408A, 408B, 408C, . . . 408X are not in a conductive state, thus the node 450 is electrically de-coupled from the node 452. When VIN rises above X*Vt, each of the plurality of semiconductor devices 408A, 408B, 408C, . . . 408X is in a conductive state and VREF is present at the node having a value approximately equal to VIN minus Vt of each of the plurality of semiconductor devices 408A, 408B, 408C, . . . 408X. In at least some examples, harmonics in VIN, such as resulting from multiple switching devices coupling to the node 450, may translate through the plurality of semiconductor devices 408A, 408B, 408C, . . . 408X to the node 452. To filter and mitigate these harmonics, the capacitor 410 functions as a de-coupling capacitor between the node 452 and the node 450. The nFET 448, in at least some examples, is a pass transistor configured to pass the signal present at the node 452 to the node 464 based on a value of the signal present at the node 454. In at least some examples, the nFET 448 may be omitted and the node 452 coupled to the node 464.

When VIN is less than Vt, the nFET 422 and the nFET 424 pull node 464 (and correspondingly VREF) to a value present at the node 468 (assumed to be about 0 V for the purpose of this description). The comparator 404 includes a left arm (e.g., analogous to an inverting input of the comparator 404) formed of the nFET 420, the nFET 422, and the nFET 424, and a right arm (e.g., analogous to a non-inverting input of the comparator 404) formed of the nFET 426, nFET 428, nFET 430, nFET 432, nFET 434, and nFET 436. Because the left arm of the comparator 404 includes fewer transistors, the left arm of the comparator 404 pulls down the node 456 to about 0 V, turning on the pFET 440. For example, because fewer transistors are in the left arm of the comparator 404, than in the right arm of the comparator 404, the left arm of the comparator 404 has a lower series resistance and therefore a stronger current driving capability than the right arm of the comparator 404 that has a larger series resistance and weaker current driving capability. The pFET 440, in some examples, is stronger than the pull down path of the nFET 442, the nFET 444, and the nFET 444, thereby pulling the node 460 up to about Vdd (e.g., setting LMODE to a logical high value).

When VIN is greater than Vt, VREF increases to VIN-Vt, as discussed above. The nFET 448 passes VREF to the node 464 until VREF reaches a value of Vdd minus Vgs of the nFET 448, protecting the comparator 404 from stress caused by VREF exceeding a voltage operating characteristics of the comparator 404. Because the node 464 has a value approximately equal to VREF, the left arm of the comparator 404 turns off and the right arm of the comparator 404 turns on, pulling the node 458 to about 0 V, turning on the pFET 414. The pFET 414, in some examples, pulls the node 456 to about Vdd, turning off the pFET 440. Because the pFET 440 is now turned off, the nFET 442, nFET 444, and nFET 446 pull the node 460 down to about 0 V (e.g., setting LMODE to a logical low value).

In at least some examples, the nFET 442, nFET 444, and nFET 446 are advantageously implemented as a MOSFET stack to limit current drawn from Vdd when LMODE is transitioning from a logical high value to a logical low value or vice versa. Because the current through the nFET 442, nFET 444, and nFET 446 is fixed based on the reference current (in some examples, to about 4 nA), no more current can be drawn by the nFET 442, nFET 444, and nFET 446 from Vdd. While three nFETs are shown stacked and coupled between the node 460 and the node 468, in various examples the number of nFETs stacked may be chosen according to desired design specifications and/or an implementation environment of the circuit 400.

Figure 5:
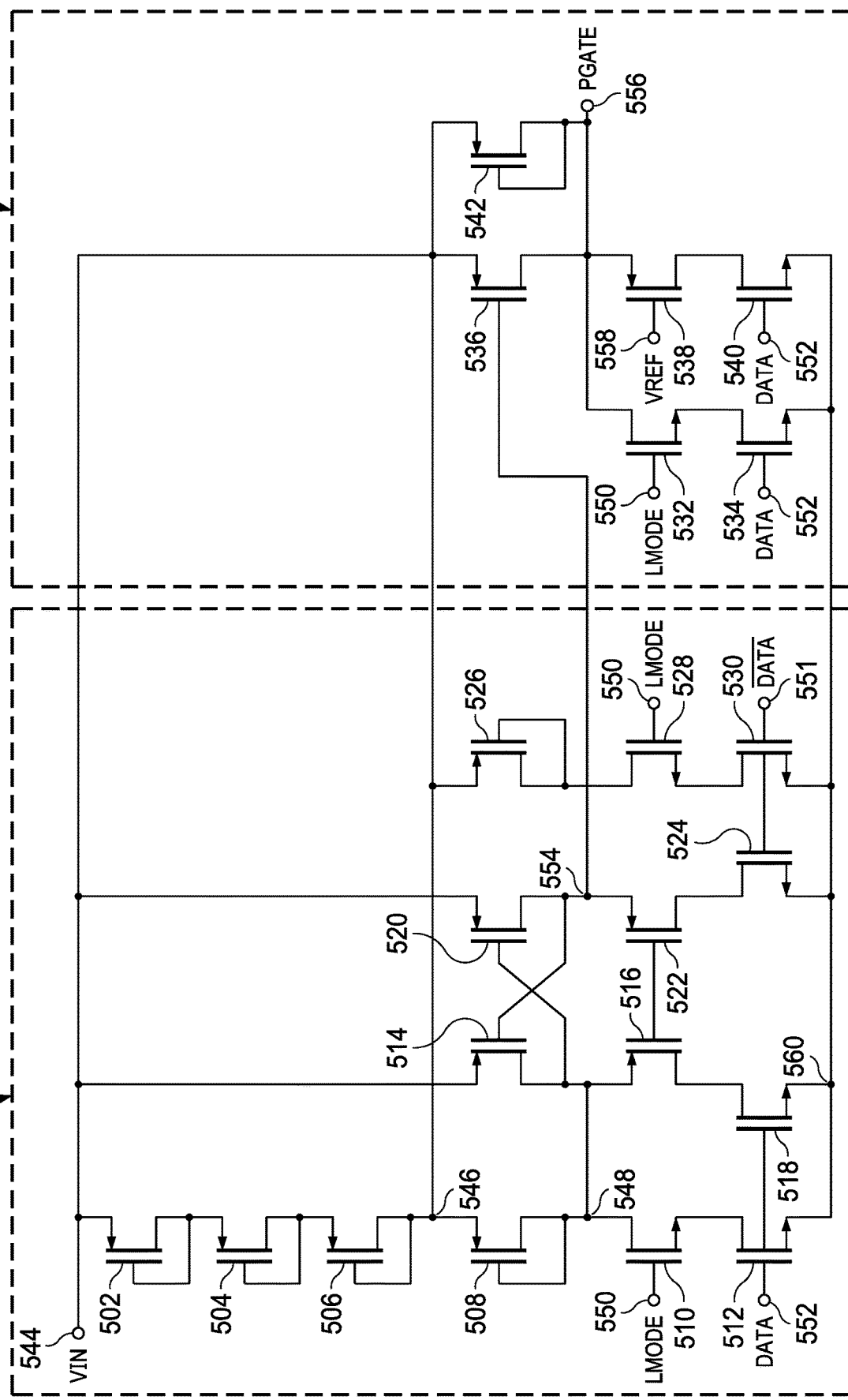
FIG. 5 shows a schematic diagram of an illustrative circuit in accordance with various examples.

Turning now to FIG. 5, a schematic diagram of an illustrative circuit 500 is shown. In at least some examples, the circuit 500 is suitable for implementation as the level shifter 204 of the circuit 200 of FIG. 2. In other examples, the circuit 500 is suitable for implementation in any application in which a single level-shifter having both full-swing and partial-swing functionality based on a value of a received control signal is desired. In at least some examples, the circuit 500 includes a level shifter 501 and a buffer 503. The level shifter 501, in some examples, includes a pFET 502, a pFET 504, a pFET 506, a pFET 508, a nFET 510, a nFET 512, a pFET 514, a pFET 516, a nFET 518, a pFET 520, a pFET 522, a nFET 524, a pFET 526, a nFET 528, and a nFET 530. The buffer 503 includes, in some examples, a nFET 532, a nFET 534, a pFET 536, a pFET 538, a nFET 540, and a pFET 542.

In an example architecture of the circuit 500, the pFET 502, the pFET 504, and the pFET 506 are coupled in series in a diode configuration between a node 544 and a node 546. The pFET 502, the pFET 504, the pFET 506, in some examples, operate as a leakage stack in the circuit 500 (e.g., to prevent leakage current in the circuit 500 at the node 548 from undesirably affecting a value of RESET), as too does the pFET 526 for the node 554. The pFET 508 has a source terminal coupled to the node 546, a gate terminal coupled to a node 548, and a drain terminal coupled to the node 548. The nFET 510 has a drain terminal coupled to the node 548, a gate terminal coupled to a node 550, and a source terminal. The nFET 512 has a drain terminal coupled to the source terminal of the nFET 510, a gate terminal coupled to a node 552, and a source terminal coupled to a node 560. The pFET 514 has a source terminal coupled to the node 544, a gate terminal coupled to a node 554, and a drain terminal coupled to the node 548. The pFET 516 has a source terminal coupled to the node 548, a gate terminal, and a drain terminal. The nFET 518 has a drain terminal coupled to the drain terminal of the pFET 516, a gate terminal coupled to the node 552, and a source terminal coupled to the node 560. The pFET 520 has a source terminal coupled to the node 544, a gate terminal coupled to the node 548, and a drain terminal coupled to the node 554. The pFET 522 has a source terminal coupled to the node 554, a gate terminal coupled to the gate terminal of the pFET 516, and a drain terminal. The nFET 524 has a drain terminal coupled to the drain terminal of the pFET 516, a gate terminal coupled to a node 551, and a source terminal coupled to the node 560. The pFET 526 has a source terminal coupled to the node 544, a gate terminal coupled to the node 554, and a drain terminal coupled to the node 554. The nFET 528 has a drain terminal coupled to the node 554, a gate terminal coupled to the node 550, and a source terminal. The nFET 530 has a drain terminal coupled to the source terminal of the nFET 528, a gate terminal coupled to the node 551, and a source terminal coupled to the node 560.

In at least some examples, the circuit 500 is configured to receive VIN at the node 544 and the node 560 is configured to couple to a ground voltage potential. The node 550 is configured to receive LMODE, for example, such as provided by the circuit 400 of FIG. 4, discussed above. The node 551 is configured to receive a data signal for controlling an output of the circuit 500, for example, such as DATA, as discussed above with respect to the circuit 200 of FIG. 2. The node 551 is configured to receive an inverse of a signal present at the node 551. The node 558 is configured to receive VREF, for example, such as provided by the circuit 400 as discussed herein. The node 556 is configured to provide PGATE for use in generating RESET.

In an example of operation of the circuit 500, when LMODE=0 (e.g., when LMODE has a logical low value), the nFET 510, the nFET 528, and the nFET 532 are turned off. When DATA=1 (e.g., when DATA has a logical high value), the nFET 518 turns on, pulling the node 548 up through the pFET 514 to about VREF plus Vgs of the pFET 514, also turning on the pFET 520. The pFET 520, when turned on, pulls the node 554 up to about VIN, turning off the pFET 536. In parallel, when DATA=1 the nFET 540 is turned on, pulling down the node 556 through the pFET 538 to about 0 V.

When DATA=0, (e.g., when DATA has a logical low value), the nFET 524 turns on, pulling down the node 554 through the pFET 522 to about VREF plus Vgs of the pFET 522, turning on the pFET 536. In parallel, when DATA=0 the nFET 540 is turned off and the pFET 526 pulls the node 556 up to about VIN.

When LMODE=1 (e.g., when LMODE has a logical high value), the nFET 510, the nFET 52, and the nFET 532 are turned on. When DATA=1, the nFET 512 turns on, pulling the node 548 down through the nFET 510 to about 0 V, also turning on the pFET 520. The pFET 520, when turned on, pulls the node 554 up to about VIN, turning off the pFET 536. In parallel, when DATA=1 the nFET 534 is turned on, pulling down the node 556 through the nFET 532 to about 0 V.

When DATA=0, (e.g., when DATA has a logical low value), the nFET 530 turns on, pulling down the node 554 down through the pFET 522 to about 0 V, turning on the pFET 536. In parallel, when DATA=0 the nFET 534 is turned off and the pFET 536 pulls the node 556 up to about VIN.

Figure 6:
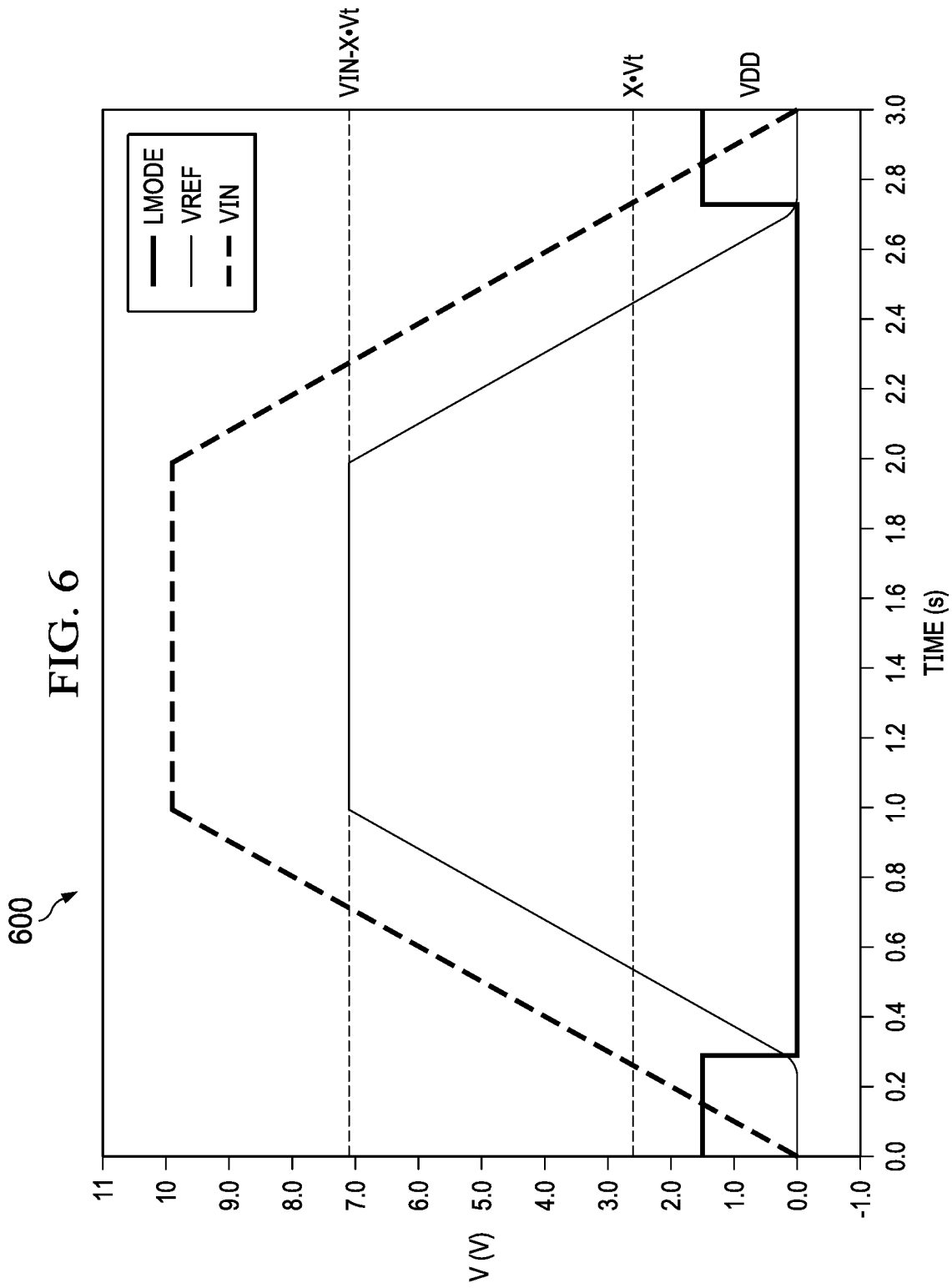
FIG. 6 shows a diagram of illustrative signals in accordance with various examples.

Turning now to FIG. 6, a diagram 600 of illustrative signal waveforms is shown. In at least some examples, the diagram 600 is representative of at least some signals present in the circuit 200 of FIG. 2 or the circuit 400 of FIG. 4, and reference may be made to elements of the circuit 200 or the circuit 400 in describing the diagram 600. For example, the diagram 600 illustrates VIN, VREF, X*Vt, VDD, and LMODE with a horizontal axis of the diagram 600 representing time and a vertical axis of the diagram 600 representing voltage.

As shown in the diagram 600 and described elsewhere herein, when VIN reaches X*Vt, VREF begins to increase, tracking VIN in slope. When VREF has a value of approximately 0 V, LMODE has a logical high value, or a value approximately equal to Vdd. When VIN exceeds X*Vt and VREF begins to increase, LMODE transitions to a logical low value, or a value approximately equal to 0 V. When VIN falls below X*Vt, VREF returns to a value of approximately 0 V and LMODE transitions back to the logical high value.

Turning now to FIG. 7, a diagram 700 of illustrative signal waveforms is shown. In at least some examples, the diagram 700 is representative of at least some signals present in the circuit 200 of FIG. 2, the circuit 400 of FIG. 4, or the circuit 500 of FIG. 5, and reference may be made to elements of the circuit 200, the circuit 400, or the circuit 500 in describing the diagram 700. For example, the diagram 700 illustrates RESET, LMODE, VREF, PGATE, and NGATE, with horizontal axes of the diagram 700 representing time and vertical axes of the diagram 700 representing voltage.

As shown in the diagram 700 and described elsewhere herein, when LMODE has a value of about 0 V, RESET alternates between having a value of about VIN and having a value of about 0 V based on PGATE and NGATE. For example, when LMODE has a value of about 0 V, NGATE has a value of about 0 V, and PGATE has a value of about VREF+Vt, RESET has a value of about VIN. When LMODE has a value of about 0 V, NGATE has a value of about Vdd, and PGATE has a value of about VIN, RESET has a value of about 0 V.

Turning now to FIG. 8, a diagram 800 of illustrative signal waveforms is shown. In at least some examples, the diagram 800 is representative of at least some signals present in the circuit 200 of FIG. 2, the circuit 400 of FIG. 4, or the circuit 500 of FIG. 5, and reference may be made to elements of the circuit 200, the circuit 400, or the circuit 500 in describing the diagram 800. For example, the diagram 800 illustrates VIN, LMODE, PGATE, NGATE, and RESET, with horizontal axes of the diagram 800 representing time and vertical axes of the diagram 800 representing voltage.

As shown in the diagram 800 and described elsewhere herein, when LMODE has a value of about Vdd (e.g., a logical high value), RESET alternates between having a value of about VIN and having a value of about 0 V based on PGATE and NGATE. For example, when LMODE has a value of about Vdd, NGATE has a value of about 0 V, and PGATE has a value of about 0 V, RESET has a value of about VIN. When LMODE has a value of about 0 V, NGATE has a value of about VIN, and PGATE has a value of about VIN, RESET has a value of about 0 V.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., field effect transistor (FET), MOSFET, n-type, p-type, drain-extended, natural, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. As used herein, in at least some examples, 0 V is approximately equal to a value present at a ground terminal and/or a ground potential. For example, the Unless otherwise stated, "about", "approximately", or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A circuit, comprising:
a first diode having a first terminal coupled to a first node and a second terminal;
a second diode coupled in series between the second terminal of the first diode and a second node;
a comparator, comprising:
a comparator first arm including a first plurality of transistor devices, the comparator first arm coupled to the second node and a third node;
a comparator second arm including a second plurality of transistor devices, the comparator second arm coupled to the third node, wherein the second plurality of transistor devices is greater in number than the first plurality of transistor devices; and
an inverter having an input coupled to the comparator and an output coupled to a fourth node
a level shifter having a first input coupled to the second node, a second input coupled to the fourth node, a third input coupled to a fifth node, and an output;
a buffer having an input coupled to the fifth node and an output;
a first p-type transistor having a gate terminal coupled to the output of the level shifter, a source terminal coupled to the first node, and a drain terminal coupled to a sixth node; and
a first n-type transistor having a gate terminal coupled to the output of the buffer, a source terminal coupled to a seventh node, and a drain terminal coupled to an eighth node.

2. The circuit of claim 1, wherein the level shifter is a partial-swing level shifter configured to output a signal ranging from zero volts to a value of a signal present at the first node when an output of the inverter is a logical low signal and output a signal ranging from a value of a signal present at the second node plus a threshold voltage to the value of the signal present at the first node when the output of the inverter is a logical high signal.

3. A circuit, comprising:
a signal generator, comprising:
a semiconductor device configured to:
receive an input voltage (VIN); and
generate a reference voltage (VREF) based on a difference between VIN and a threshold voltage; and
a comparator coupled to an inverter and configured to generate a control signal (LMODE) according to VREF with respect to zero; and
a level shifter coupled to the signal generator and configured to:
generate an output signal having a value within a range having a lower bound of zero volts and an upper bound of VIN when LMODE is being asserted; and
generate the output signal having a value within a range having a lower bound of VREF plus the threshold voltage of the semiconductor device and an upper bound of VIN when LMODE is not being asserted.

4. The circuit of claim 3, wherein LMODE is asserted when VREF is less than or equal to zero, and wherein LMODE is not asserted when VREF is greater than zero.

5. The circuit of claim 3, wherein the semiconductor device comprises:
a first p-type transistor having a source terminal coupled to a VIN node, a gate terminal, and a drain terminal coupled to the gate terminal of the first p-type transistor;
a second p-type transistor having a source terminal coupled to the drain terminal of the first p-type transistor, a gate terminal, and a drain terminal coupled to the gate terminal of the second p-type transistor;
a third p-type transistor having a source terminal coupled to the drain terminal of the second p-type transistor, a gate terminal, and a drain terminal coupled to the gate terminal of the third p-type transistor; and
a fourth p-type transistor having a source terminal coupled to the drain terminal of the third p-type transistor, a gate terminal coupled to a VREF node, and a drain terminal coupled to the VREF node.

6. The circuit of claim 3, wherein the comparator comprises:
a first n-type transistor having a gate terminal coupled to a comparator reference node, a drain terminal coupled to a first node, and a source terminal electrically coupled to a VREF node;
a second n-type transistor having a gate terminal coupled to the comparator reference node, a drain terminal electrically coupled to the VREF node, and a source terminal;
a third n-type transistor having a gate terminal coupled to the comparator reference node, a drain terminal coupled to the source terminal of the second n-type transistor, and a source terminal coupled to a ground terminal;
a fourth n-type transistor having a gate terminal coupled to the comparator reference node, a drain terminal coupled to a second node, and a source terminal;
a fifth n-type transistor having a drain terminal coupled to the source terminal of the fourth n-type transistor, a gate terminal coupled to the comparator reference node, and a source terminal;
a sixth n-type transistor having a drain terminal coupled to the source terminal of the fifth n-type transistor, a gate terminal coupled to the comparator reference node, and a source terminal;
a seventh n-type transistor having a drain terminal coupled to the source terminal of the sixth n-type transistor, a gate terminal coupled to the comparator reference node, and a source terminal;
an eighth n-type transistor having a drain terminal coupled to the source terminal of the seventh n-type transistor, a gate terminal coupled to the comparator reference node, and a source terminal;
a ninth n-type transistor having a drain terminal coupled to the source terminal of the eighth n-type transistor, a gate terminal coupled to the comparator reference node, and a source terminal coupled to the ground terminal;
a fifth p-type transistor having a source terminal coupled to a supply voltage (Vdd) node, a gate terminal coupled to the Vdd node, and a drain terminal;
a sixth p-type transistor having a source terminal coupled to the drain terminal of the fifth p-type transistor, a gate terminal coupled to an output node, and a drain terminal coupled to the first node;

a seventh p-type transistor having a source terminal coupled to the Vdd node, a gate terminal coupled to a fourth node, and a drain terminal coupled to the first node; and
an eighth p-type transistor having a source terminal coupled to the Vdd node, a gate terminal coupled to the fourth node, and a drain terminal coupled to the fourth node.

7. The circuit of claim 3, wherein the inverter comprises:
a ninth p-type transistor having a source terminal coupled to a supply voltage (Vdd) node, a gate terminal coupled to a fifth node, and a drain terminal coupled to a fourth node;
a tenth p-type transistor having a source terminal coupled to the Vdd node, a gate terminal coupled to the fourth node, and a drain terminal coupled to an output node;
a tenth n-type transistor having a drain terminal coupled to the output node, a gate terminal coupled to a comparator reference node, and a source terminal;
an eleventh n-type transistor having a drain terminal coupled to the source terminal of the tenth n-type transistor, a gate terminal coupled to the comparator reference node, and a source terminal; and
a twelfth n-type transistor having a drain terminal coupled to the source terminal of the eleventh n-type transistor, a gate terminal coupled to the comparator reference node, and a drain terminal coupled to a ground terminal.

8. A system, comprising:
a battery;
a load coupled to the battery and configured to receive an input voltage (VIN) from the battery; and
a supply voltage supervisor (SVS) coupled to the battery and the load, the SVS comprising an output buffer that comprises:
  a signal generator configured to:
    receive VIN and generate a reference voltage (VREF) according to VIN minus a threshold voltage of a semiconductor device; and
    generate a control signal (LMODE) according to a value of VREF with respect to zero; and
  a level shifter coupled to the signal generator and configured to:
    generate an output signal having a value within a range having a lower bound of zero volts and an upper bound of VIN when LMODE has a first logical value; and
    generate the output signal having a value within a range having a lower bound of VREF plus the threshold voltage of the semiconductor device and an upper bound of VIN when LMODE has a second logical value.

9. The system of claim 8, wherein LMODE has the first logical value when VIN has a value such that, when a p-type transistor of the output buffer receives VIN at a source terminal and zero volts at a gate terminal, a gate-to-source (Vgs) voltage of the transistor exceeds a specified operating tolerance of the transistor.

10. The system of claim 8, wherein the signal generator comprises:
a VREF generator configured to generate VREF;
a comparator coupled to the VREF generator and configured to compare VREF to a value of zero to generate a comparison result; and
an inverter coupled to the comparator and configured to invert the comparison result to generate LMODE, wherein LMODE has the first logical value when VREF is less than zero, and wherein LMODE has the second logical value when VREF is greater than zero.

11. The system of claim 10, wherein the VREF generator comprises the semiconductor device, and wherein the semiconductor device comprises:
a first p-type transistor having a source terminal coupled to a VIN node, a gate terminal, and a drain terminal coupled to the gate terminal of the first p-type transistor;
a second p-type transistor having a source terminal coupled to the drain terminal of the first p-type transistor, a gate terminal, and a drain terminal coupled to the gate terminal of the second p-type transistor;
a third p-type transistor having a source terminal coupled to the drain terminal of the second p-type transistor, a gate terminal, and a drain terminal coupled to the gate terminal of the third p-type transistor; and
a fourth p-type transistor having a source terminal coupled to the drain terminal of the third p-type transistor, a gate terminal coupled to a VREF node, and a drain terminal coupled to the VREF node.

12. The system of claim 10, wherein the comparator comprises:
a first n-type transistor having a gate terminal coupled to a comparator reference node, a drain terminal coupled to a first node, and a source terminal electrically coupled to a VREF node;
a second n-type transistor having a gate terminal coupled to the comparator reference node, a drain terminal electrically coupled to the VREF node, and a source terminal;
a third n-type transistor having a gate terminal coupled to the comparator reference node, a drain terminal coupled to the source terminal of the second n-type transistor, and a source terminal coupled to a ground terminal;
a fourth n-type transistor having a gate terminal coupled to the comparator reference node, a drain terminal coupled to a second node, and a source terminal;
a fifth n-type transistor having a drain terminal coupled to the source terminal of the fourth n-type transistor, a gate terminal coupled to the comparator reference node, and a source terminal;
a sixth n-type transistor having a drain terminal coupled to the source terminal of the fifth n-type transistor, a gate terminal coupled to the comparator reference node, and a source terminal;
a seventh n-type transistor having a drain terminal coupled to the source terminal of the sixth n-type transistor, a gate terminal coupled to the comparator reference node, and a source terminal;
an eighth n-type transistor having a drain terminal coupled to the source terminal of the seventh n-type transistor, a gate terminal coupled to the comparator reference node, and a source terminal;
a ninth n-type transistor having a drain terminal coupled to the source terminal of the eighth n-type transistor, a gate terminal coupled to the comparator reference node, and a source terminal coupled to the ground terminal;
a fifth p-type transistor having a source terminal coupled to a supply voltage (Vdd) node, a gate terminal coupled to the Vdd node, and a drain terminal;
a sixth p-type transistor having a source terminal coupled to the drain terminal of the fifth p-type transistor, a gate terminal coupled to an output node, and a drain terminal coupled to the first node;

a seventh p-type transistor having a source terminal coupled to the Vdd node, a gate terminal coupled to a fourth node, and a drain terminal coupled to the first node; and an eighth p-type transistor having a source terminal coupled to the Vdd node, a gate terminal coupled to the fourth node, and a drain terminal coupled to the fourth node.

13. The system of claim 8, where the SVS further comprises an inverter having an input configured to receive an inverted data signal from a voltage sensing circuit and an output coupled to an input of the level shifter, wherein the output of the level shifter is at least partially based on a signal output by the inverter.

* * * * *